United States Patent [19]

Miyauchi et al.

[11] Patent Number: 5,137,767
[45] Date of Patent: Aug. 11, 1992

[54] PARTIALLY COATED ASSEMBLY STRUCTURE AND METHOD FOR MAKING A CERAMIC LID FOR HERMETIC SEALING OF AN EPROM CIRCUIT

[75] Inventors: Nobuaki Miyauchi; Hiroshi Yonemasu; Bakji Cho; Chong-Il Park, all of San Diego, Calif.

[73] Assignee: Kyocera America, Inc., San Diego, Calif.

[21] Appl. No.: 574,663

[22] Filed: Aug. 29, 1990

[51] Int. Cl.$^5$ .......................... B32B 3/08; B32B 3/10
[52] U.S. Cl. ...................................... 428/76; 428/138; 428/201; 428/203; 428/408; 174/52.3; 174/52.4
[58] Field of Search ................. 428/67, 138, 201, 203, 428/408, 76; 174/52.3, 52.4

[56] References Cited
U.S. PATENT DOCUMENTS 4,326,214  4/1982  Trueblood ........................ 174/52.3
4,727,221  2/1988  Saitou et al. ..................... 174/52.4

Primary Examiner—Alexander S. Thomas
Attorney, Agent, or Firm—Spensley Horn Jubas & Lubitz

[57] ABSTRACT

A partially coated assembly structure and a method for making a ceramic lid for a hermetically sealed package for an EPROM circuit are disclosed. The assembly structure includes, in combination, a ceramic lid, a UV transparent lens, and two fixtures for supporting the lens in the lid. The two fixtures are coated with a non-lens wetting film in predetermined areas where contact is made between the fixtures and the lens, and between the fixtures and the lid. The UV transparent lens is hermetically sealed to the ceramic lid by firing the assembly structure. The assembly structure prevents the lens from attracting foreign particulate matter during firing, thereby leaving the surfaces of the lens clean. The method provides a ceramic lid having a UV transparent lens hermetically sealed thereto, which finds wide use in integrated circuit packages for high-density EPROM's because of the untainted surfaces of the lens.

10 Claims, 1 Drawing Sheet

PARTIALLY COATED ASSEMBLY STRUCTURE AND METHOD FOR MAKING A CERAMIC LID FOR HERMETIC SEALING OF AN EPROM CIRCUIT

BACKGROUND OF THE INVENTION

1. Field of the Invention

This invention relates generally to the structure and method for making a ceramic lid suitable for use in packaging an erasable programmable read only memory (EPROM) device, and more particularly, to a ceramic lid including an ultraviolet light (UV) transparent lens hermetically sealed thereto, the surfaces of which are substantially free from foreign particulate matter.

2. Related Art

An EPROM circuit is a memory device wherein the memory storage circuits are erasable by irradiation (for example, by UV), and the memory storage circuits can be reprogrammed electrically. EPROM devices must be hermetically sealed in order to be protected from damage and to insure reliability. However, they must also be accessible for irradiation. Thus, EPROM circuits are normally placed within a hermetically sealed protective package that includes a ceramic lid with a UV transparent lens. The UV transparent lens allows the EPROM circuit to be exposed to incoming UV light. EPROM chips within such protective packages are connected to other electronic circuits outside the packages. One such EPROM package is disclosed in U.S. Pat. No. 4,326,214 to R. K. Trueblood. Another type of the EPROM package is shown in U.S. Pat. No. 4,727,221 to Saitou and Bessho, which is concerned with an EPROM device having a shading cover adhered onto a UV window.

Referring to FIGS. 1 and 2, it has been a common practice to hermetically seal a UV transparent lens 10 to a ceramic lid 12 by placing the lens 10 within a preformed aperture 14 of the lid 12 and sandwiching the lid 12 and the lens 10 between paired fixtures 16, 18. The fixtures 16, 18 are each configured to contact the lens 10 and the lid 12 as shown in FIG. 2. An assembly structure 20 results when the fixtures 16, 18, a lens 10, and a lid 12 are fitted together. Upon firing the assembly structure 20, a hermetic seal forms between the lens 10 and the lid 12.

The fixtures 16, 18 are generally made of carbon or graphite because of their basic non-wetting nature with respect to glass, which is often the material of the lens. However, such glass materials are so reactive at high temperatures that they attack both carbon and graphite fixtures, which then tend to disintegrate, flake, or chip. As a result, after firing, there is a considerable amount of foreign particles (principally carbon) deposited on the lens. Also, the surfaces of the lens may be damaged. This particle deposition severely impairs the ability of the lens to pass UV without diffusing it. Therefore, the foreign particles must be removed before the lid 12 and the lens 10 can be used in a semiconductor package. Typically, an alkaline solution is used to clean the lens. However, some of the foreign particles embed in the surface of the lens, and therefore, the alkaline solution cleaning alone does not give satisfactory results; nor can it smooth the surface. On the contrary, the alkaline solution treatment (e.g., boiling a lens in an alkaline solution) roughens the surface of the lens. An additional lens processing step is thus needed. This is normally done by firing the lens again to fire-polish its surface. Although the surface of the lens may be smoothed, the firing does not further eliminate the remaining particles from the lens. This significant level of impurities in an otherwise UV transparent lens is a serious problem where high performance EPROM devices are required.

Accordingly, as the semiconductor industry moves forward to manufacturing more highly integrated EPROM devices, there is an ever-increasing need to minimize or eliminate the noted impurity problems and to provide a ceramic lid having a high grade UV transparent lens suitable for use in a high-density EPROM package.

SUMMARY OF THE INVENTION

It is the prime object of this invention to provide a ceramic integrated circuit package lid having a UV transparent lens, the surfaces of which are substantially free from foreign particulate matter, and which avoid the defects of a UV transparent lens produced and processed by conventional techniques.

It is another object of this invention to provide an assembly structure and a method for making a ceramic lid having a hermetically sealed UV transparent lens, the surfaces of which are substantially free from foreign particulate matter.

In accordance with this invention, there is provided an assembly structure for making a ceramic lid for an EPROM package. The assembly includes, in combination, a ceramic lid, a UV transparent lens, and two fixtures. Each fixture has a contact surface which defines a coated region. The coated region is coated with a non-lens wetting film that will not adhere to the lens at a high temperature. One fixture is positioned on the ceramic lid such that the contact surface contacts the lens, while the other fixture supports the ceramic lid such that the contact surface thereof contacts the lens as well as the periphery of the ceramic lid. Contact between the contact surface and the lens is further characterized in that the coated region contacts a predetermined area of the surface of the lens. The assembly structure is ready for firing to hermetically seal the lens to the lid.

In accordance with this invention, there is also provided a method for making a ceramic lid for an EPROM package by firing the above assembly structure in an inert atmosphere. The method includes the steps of constructing the assembly structure, firing the lens to the lid, dismantling the fixtures from the fired ceramic lid, and cleaning the fired and sealed lens with an alkaline solution. The lens thus produced has clean surfaces which are substantially free from foreign particulate matter.

These and other objects will become more apparent from the following description and drawings.

BRIEF DESCRIPTION OF THE DRAWINGS

Like reference numbers in the various drawings refer to like elements.

DETAILED DESCRIPTION OF THE INVENTION

Figure 1:
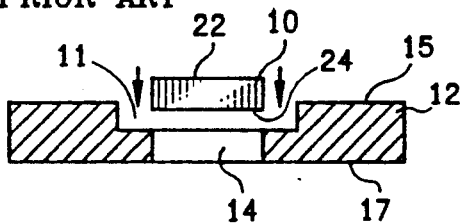
FIG. 1 is a sectional view showing a manner in which a UV transparent lens is inserted into a ceramic lid.

A ceramic lid 12, as shown in FIG. 1, is provided with a preformed aperture 14 at its center, the size of which is adapted to receive a UV transparent lens 10. The lens 10 has a first surface 22 and a second surface 24. The lid 12 has a corresponding first surface 15 and a second surface 17. The aperture 14 may be a part of a depression 11 formed in the lid 12. The lid 12 is a ceramic material such as one of the oxides of aluminum, beryllium, and/or magnesium which are conveniently employed in the semiconductor industry. The lens 10 can be of any material that will pass UV and will have a suitable coefficient of thermal expansion, such as quartz glass or alumina borosilicate. The coefficient of thermal expansion of the lens 10 would ideally match that of the lid 12. The lens 10 is placed within the aperture 14 so as to be in registration therewith.

Figure 3:
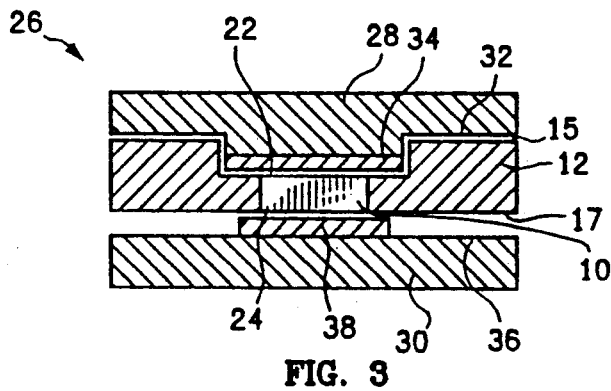
FIG. 3 is a exploded sectional view of an assembly struture according to one embodiment of this invention.

Turning now to FIG. 3, a preferred embodiment of the assembly structure 26 of this invention is illustrated and comprises the lens 10, the lid 12, and a pair of fixtures 28, 30. The first fixture 28 has a contact surface 32 which defines a coated region 34. Similarly, the second fixture 30 has a contact surface 36 which defines a coated region 38. The coated regions 34, 38 do not fully extend over the contact surfaces 32, 36, thus leaving uncoated regions on the contact surfaces 32, 36.

Figure 4:
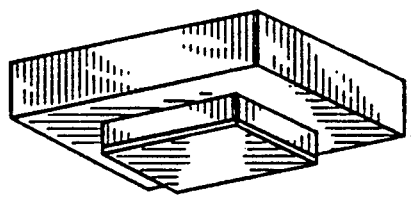
FIG. 4 is a perspective view of a fixture to be used in this invention.

Both fixtures 28, 30 can be made of any material as long as the material will maintain its structural integrity and, preferably will not wet the material of the lens 10 during firing. Metallic or ceramic materials are preferred, although carbon and graphite are both usable but less preferred. The fixtures 28, 30 can be the same or different in dimension. As shown in FIG. 3, the fixture 28 may be conformed to the shape of the depression 11. FIG. 4 shows such an embodiment of the fixture 28.

The coated regions 34, 38 are the regions where the contact surfaces 32, 36 are coated with a non-lens wetting film. The film can be formed from any material that will keep the coated regions 34, 38 clean and will not wet the lens 10 at a high temperature. Suitable substances which can be used include carbon (which is preferred), boron nitride, silicon carbide, and silicon nitride. The film may be applied to the contact surfaces 32, 36 by a variety of methods known in the art. Examplary techniques are chemical vapor deposition method and sputtering where the coated material is deposited on a fixture substrate from a source. In the case of a carbon film, the preferred method of application is to spray a contact surface with a colloidal carbon solution. The film protects the lens by not allowing the fixtures to directly contact the lens. Thus, unlike the prior art where the fixtures may damage the lens or partially disintegrate, leaving particulate impurities on the lens, the application of a non-lens wetting film on the contact surfaces obviates the drawbacks of the prior art. The thickness of the film is not critical as a very thin film produced by the chemical vapor deposition is just as effective as a relatively thick film produced by other methods (e.g., spraying).

The first fixture 28 is mounted in a depressed area 11 of the lid 12. The resulting configuration is that the contact surface 32 contacts the first surface 22 of the lens 10 and also contacts the lid 12 at least around the periphery thereof enclosing the lens 10. The coated region 34 is defined as contacting and covering a central area of the first surface 22 of the lens 10, which area occupies not less than about 85% (preferably, at least about 89%) of the total area of the lens. The coated region 34 can further extend beyond a region corresponding to the first surface 22 of the lens 10, as shown in FIG. 3. Either the coated region 34 or an uncoated region of the contact surface 32 contacts the first surface 15 of the ceramic lid 12 at least around the periphery thereof enclosing the lens 10. The second fixture 30 is placed underneath the lid 12 so as to support the lid 12 and the lens 10 disposed therein. The contact surface 36 contacts the second surface 24 of the lens 10 and also contacts the lid 12 at least around the periphery thereof enclosing the lens 10. The coated region 38 is defined as contacting and covering a central area of the first surface 24 of the lens 10, which area occupies not less than about 85% (preferably at least about 89%) of the total area of the lens. The coated region 38 can further extend beyond a region corresponding to the second surface 24 of the lens 10, as shown in FIG. 3. Either the coated region 38 or an uncoated region of the contact surface 36 contacts the second surface 17 of the ceramic lid 12 at least around the periphery thereof enclosing the lens 10.

Figure 2:
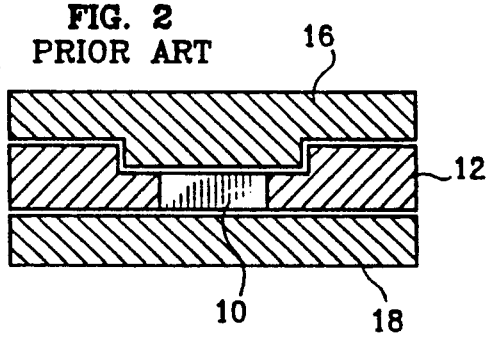
FIG. 2 is a sectional view of a prior art assembly structure.

The central areas on the lens 10 to be contacted by the coated regions 34, 38 are considered critical because they significantly contribute to passing UV. Conversely, the remaining peripheral areas on the lens are considered noncritical. Therefore, even if these peripheral areas are contaminated by foreign particles as a result of directly contacting the uncoated regions of the fixtures 28, 30, such contamination will not have a notable effect on the overall transparency of the lens to UV. The coated regions 34, 38 preclude the contact surfaces 32, 36 from directly coming into contact with at least the critical central areas of the lens 10 through which most of UV is transmitted. During firing, some of the film material (which is relatively thin, and does not tend to aggregate into particles) may segregate from the film and adhere to the lens. This, however, does not leave film particles embedded in the lens. Any deposited film material may thus be removed during a subsequent washing step. In contrast, the prior art assembly structure as shown in FIG. 2 requires its fixtures to directly contact the critical area of the lens, which results in deposition or embedment of foreign particulate matter thereon.

After the assembly structure 26 is constructed with all components in place, as shown in FIG. 3, it is fired in an inert atmosphere at a high temperature sufficient to thereby partially melt the lens 10 causing it to hermetically fuse to the lid 12. The firing temperature is typically at least about 800° C. Although firing can be done in air, it is preferably carried out in a non-oxidizing inert atmosphere such as nitrogen or hydrogen. After firing, the fixtures 28, 30 are disengaged from the lid 12 and the lens 10. The surfaces 22, 24 of the lens are cleaned by treatment with an alkaline cleaning solution, whereby any film material and foreign particles adhered to the lens can easily be removed from the surfaces. A typical procedure for cleaning involves boiling the lens in an alkaline solution for a short period of time. The resultant lens 10 proves to have surfaces 22, 24 which are substantially free from foreign particulate matter.

Figure 5:
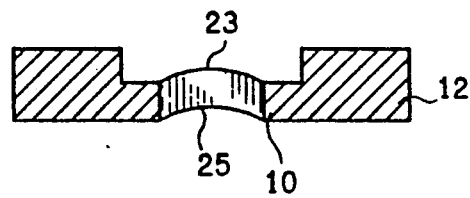
FIG. 5 is a sectional view of a finished ceramic lid obtained according to one embodiment of this invention.

When the firing operation is carried out according to the above procedure, the lens 10 will have planar faces. The lid 12 that has the lens 10 hermetically sealed thereto is preferably subjected to a second-firing step. This additional firing step not only polishes the surfaces 22, 24 of the lens 10, but also can create a concave first face 23 and a convex second face 25, as shown in FIG. 5. However, in order for the lens 10 to be provided with the concave first face 23 and the convex second face 25, the lid 12 must be fired in an inverted manner where the first surface 22 faces downward and the second surface 24 faces upward, respectively. Upon firing, the concave first face 23 and the convex second face 25 result by virtue of gravity. The convex second face 25 is preferable as compared to a planar face 24 because the shape of the second face 25 protects the lens from damage (e.g., scratches) while the lid 12 is being carried on a conveyor for further processing.

This invention insures that the lens of a fired lid is substantially free from foreign particulate matter. The final lid produced with such an untainted lens is particularly suited for use in a package for high-density EPROM integrated circuits.

Although this invention has been described by way of several embodiments thereof, it should be realized that many alternatives, modifications, and variations will be apparent to those skilled in the art of the foregoing description. Accordingly, it is intended to embrace all such alternatives, modifications, and all variations as falling within the spirit and broad scope of the appended claims.

We claim:

1. An assembly structure for making a fired ceramic lid for an erasable programmable read only memory package, the ceramic lid including a hermetically sealed ultraviolet transparent lens, the surfaces of which are substantially free from foreign particulate matter, the assembly structure comprising:
   - a ceramic lid having an aperture formed therein, the ceramic lid having a first surface and a second surface;
   - an ultraviolet transparent lens positioned within the aperture of the ceramic lid, the lens having a first surface and a second surface;
   - a first fixture having a contact surface that defines a first coated region, the first coated region being coated with a non-lens wetting film, the first fixture being mounted on the first surface of the ceramic lid, such that the first coated region of the first fixture contacts substantially the entire first surface of the lens; and
   - a second fixture having a contact surface that defines a second coated region, the second coated region being coated with a non-lens wetting film, the second fixture supporting the ceramic lid from the second surface thereof, such that the second coated region of the second fixture contacts substantially the entire second surface of the lens and either the second coated region of the second fixture or an uncoated region of the contact surface of the second fixture contacts the second surface of the ceramic lid at least around the periphery thereof enclosing the lens.

2. The assembly structure according to claim 1, wherein the contact between the first coated region of the first fixture and the first surface of the lens is made in a central area of the first surface of the lens occupying not less than about 85% of the total lens area, and the contact between the second coated region of the second fixture and the second surface of the lens is made in a central area of the second surface of the lens occupying not less than about 85% of the total lens area.

3. The assembly structure according to claim 2, wherein the contact between the first coated region of the first fixture and the first surface of the lens is made in a central area of the first surface of the lens occupying not less than about 89% of the total lens area, and the contact between the second coated region of the second fixture and the second surface of the lens is made in a central area of the second surface of the lens occupying not less than about 89% of the total lens area.

4. The assembly structure according to claim 2, wherein either the first coated region of the first fixture or an uncoated region of the contact surface of the first fixture contacts the first surface of the ceramic lid at least around the periphery thereof enclosing the lens.

5. The assembly structure according to claim 2, wherein the first and the second fixture are made of a metallic material or a ceramic material.

6. The assembly structure according to claim 2, wherein the non-lens wetting film is formed from a substance selected from the group consisting of colloidal carbon, boron nitride, silicon carbide, and silicon nitride.

7. The assembly structure according to claim 6, wherein the substance is colloidal carbon.

8. The assembly structure according to claim 6, wherein the aperture is a part of a depression formed in the ceramic lid and the first fixture is conformed to the shape of the depression.

9. The assembly structure according to claim 1, wherein the first and second fixtures are composed of a material that maintains its structural integrity during firing.

10. An assembly fixture for making a fixed ceramic lid for an erasable programmable read only memory package, the ceramic lid having a first and a second surface and including an ultraviolet transparent lens positioned within an aperture, the ultraviolet transparent lens being hermetically sealed within the aperture and having surfaces which are substantially free from foreign particulate matter, the assembly fixture comprising:
   a. a first element having a contact surface that defines a first coated region, the first coated region being coated with a non-lens wetting film, the first fixture being mounted on the first surface of the ceramic lid, such that the first coated region of the first fixture contacts substantially the entire first surface of the lens; and
   b. a second element having a contact surface that defines a second coated region, the second coated region being coated with a non-lens wetting film, the second fixture supporting the ceramic lid from the second surface thereof, such that the second coated region of the second fixture contacts substantially the entire second surface of the lens and either the second coated region of the second fixture or an uncoated region of the contact surface of the second fixture contacts the second surface of the ceramic lid at least around the periphery thereof enclosing the lens.

* * * * *